United States Patent [19]
McMahon

[11] Patent Number: 6,075,712
[45] Date of Patent: Jun. 13, 2000

[54] FLIP-CHIP HAVING ELECTRICAL CONTACT PADS ON THE BACKSIDE OF THE CHIP

[75] Inventor: John F. McMahon, Phoenix, Ariz.

[73] Assignee: Intel Corporation, Santa Clara, Calif.

[21] Appl. No.: 09/227,650

[22] Filed: Jan. 8, 1999

[51] Int. Cl.[7] .................................................. H05K 7/02
[52] U.S. Cl. ........................... 361/783; 361/767; 361/768; 361/792; 257/690; 257/698; 257/700; 257/702; 257/723; 257/724; 257/773; 257/777; 257/784; 174/255; 174/256; 438/125
[58] Field of Search .................................... 361/767, 768, 361/792–795, 783; 257/684, 690, 698, 700, 701, 702, 723, 724, 735, 737, 738, 773, 774, 775, 777, 778, 780, 784; 438/108, 125, 928; 333/185; 174/255, 256, 258

[56] References Cited

U.S. PATENT DOCUMENTS

| | | | |
|---|---|---|---|
| 4,074,342 | 2/1978 | Honn et al. | 361/783 |
| 5,032,896 | 7/1991 | Little et al. | 257/698 |
| 5,436,197 | 7/1995 | Hause | 257/723 |
| 5,514,613 | 5/1996 | Santadrea et al. | 438/125 |
| 5,640,049 | 6/1997 | Rostoker et al. | 257/778 |
| 5,731,223 | 3/1998 | Padmanabhan | 438/125 |
| 5,825,080 | 10/1998 | Imaoka et al. | 257/700 |

FOREIGN PATENT DOCUMENTS 9-36158  2/1997  Japan .

Primary Examiner—Leo P. Picard
Assistant Examiner—John B. Vigushin
Attorney, Agent, or Firm—Blakely, Sokoloff, Taylor & Zafman LLP

[57] ABSTRACT

An integrated circuit device. The integrated circuit device includes a semiconductor substrate having a first surface and a second surface opposite the first surface. Circuit elements are formed within the first surface. A plurality of bump contacts are located on the first surface and connected to the circuit elements. Bond pads that are also connected to circuit elements are located within or on the second surface.

22 Claims, 8 Drawing Sheets

FLIP-CHIP HAVING ELECTRICAL CONTACT PADS ON THE BACKSIDE OF THE CHIP

BACKGROUND OF THE INVENTION

1. Field of the Invention

The present invention relates generally to a semiconductor chip and, more specifically, to a flip-chip having bond pads on the backside of the chip that are electrically coupled to active devices in the chip.

2. Discussion of Related Art

Within the integrated circuit industry there is a continuing effort to increase integrated circuit speed as well as device density. As a result of these efforts, there is a trend towards using flip chip technology when packaging complex high-speed integrated circuits. Flip chip technology is also known as control collapse chip connection (C4) technology. In flip chip technology, the integrated circuit die is flipped upside down. By flipping the integrated circuit die upside down and exposing the backside, wire bonds may be used to provide direct electrical connections from bond pads formed on the die directly to a corresponding set of pads on a package.

In the following discussion reference will be made to a number of drawings. The drawings are provided for descriptive purposes only and are not drawn to scale.

FIG. 1 illustrates a flip chip 102 that is electrically coupled to a PGA (Pin Grid Array) package 110 by solder bumps (or ball bonds) 104. Chip 102 has a top-side surface 108 and a backside surface 107. The active regions (not shown) of the integrated circuit are formed within the top-side surface 108 of the of the semiconductor chip 102. Because the contact pads of integrated circuit device 102 are located on the top-side surface 108 of the device, the die must be flipped upside down so that it may be attached to package 110.

Today, the trend is toward more complex semiconductor chips having diminished circuit feature sizes and more power, ground and signal contacts. Since the size of the chip is being held at essentially the same size, there has been a movement toward the development of "fine pitch" interconnect technology and circuit board technology which results in more complex and higher cost circuit boards and packages. In addition, with increasing bus frequencies and lowering "on die" voltages, the ability to adequately and efficiently distribute power on the chip is growing increasingly difficult.

SUMMARY OF THE INVENTION

An integrated circuit device is disclosed. The integrated circuit device includes a semiconductor substrate having a first surface, a second surface opposite the first surface, and a conductive region located over the first surface. Circuit elements are formed within the first surface. A plurality of contact pads are located on the outer surface of the conductive region and connected to the circuit elements. Contact pads that are also connected to circuit elements are located within or on the second surface.

BRIEF DESCRIPTION OF THE DRAWINGS

The invention as is further described by way example with reference to the accompanying drawings wherein.

DETAILED DESCRIPTION OF THE INVENTION

A semiconductor chip having contacts on both the top-side and the backside of the chip is described. In the following description, numerous specific details are set forth such as material types, processes, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

Figure 1:
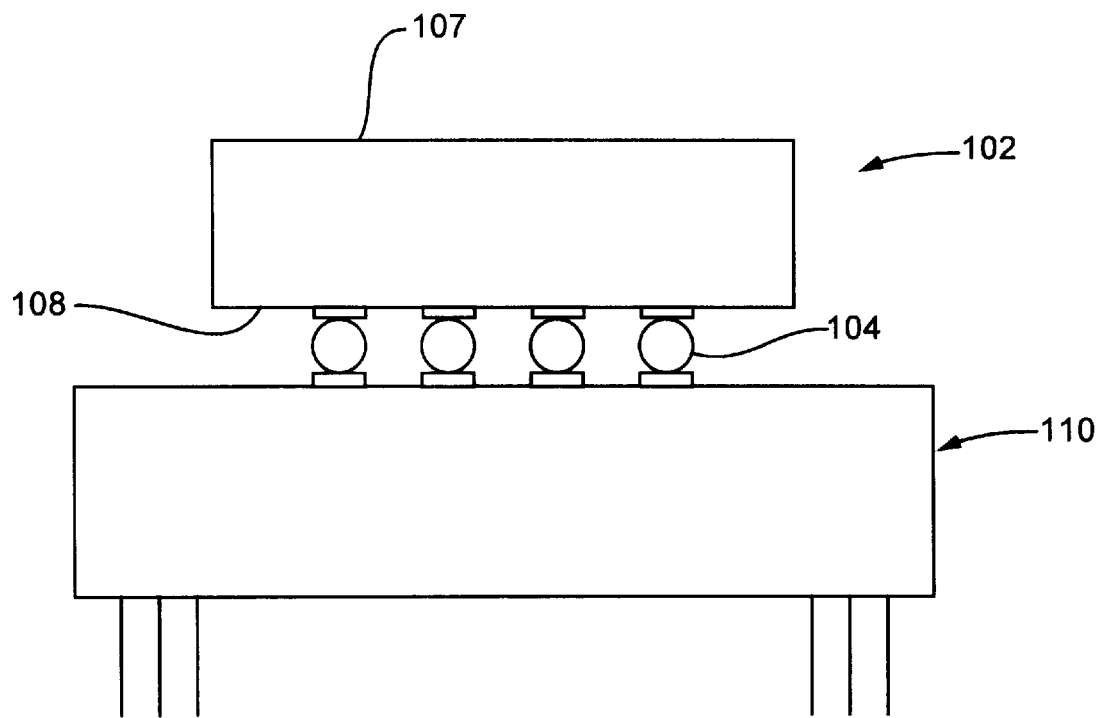
FIG. 1 is a sectioned side view of a conventional "flip chip" semiconductor chip attached to a package.
Figure 2A:
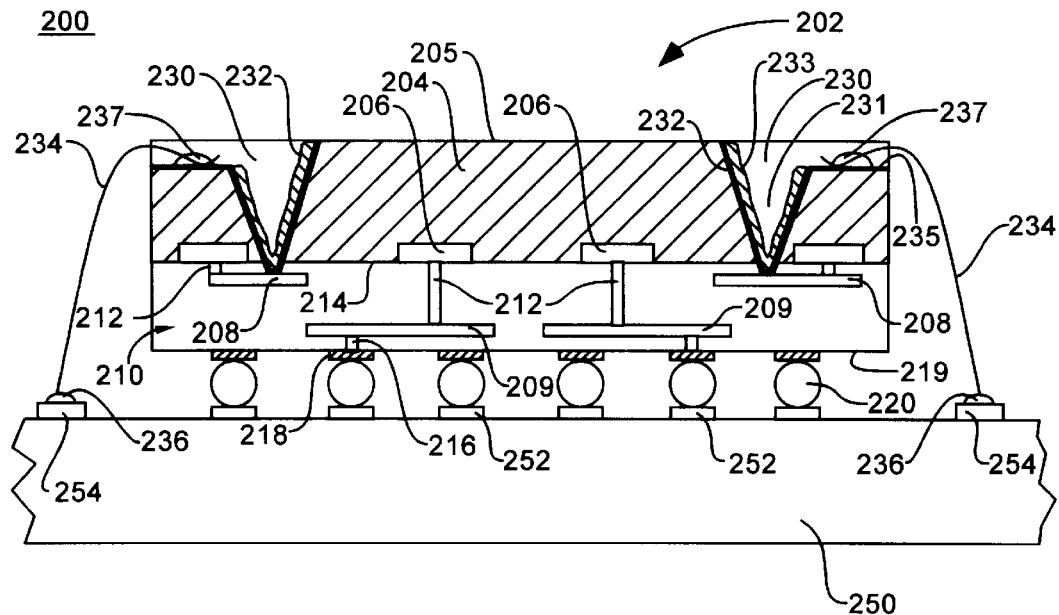
FIG. 2A is a sectioned side view of a semiconductor chip and package in one embodiment of the present invention.

FIG. 2A illustrates a side view of a chip and package assembly 200 in one embodiment of the present invention. The assembly 200 includes a semiconductor chip 202 that is electrically coupled to a package substrate 250 via a plurality of solder bump connections 220 and a plurality of wire bonds 234. Chip 202 includes a semiconductor substrate 204 having a plurality of circuit elements 206 formed within the frontside surface 214 of the semiconductor substrate 204. A conductor region 210 is located between the frontside surface 214 and topside surface 219 of semiconductor substrate 204. A conductor region 210 generally includes multiple layers of conductive lines 208 and 209 that are electrically coupled to the circuit elements 206 by conductive vias 212. The conductive lines 208 and 209 may be any one of several conductive materials such as tungsten, titanium, aluminum, copper, doped silicon, doped polysilicon, or a metal silicide layer. Conductive lines 208 and 209 are typically deposited on and separated by dielectric layers. Although only two conductive layers are shown in FIG. 2A, it is noted that conductive region 210 generally includes additional conductive layers. External connections to the chip 202 are made through a first set of electrical contact pads 218 located on the top-side surface 219 of the conductor region 210. Contact pads 218 are electrically coupled to conductive lines 208 and 209 by conductive vias 216.

Additional electrical contact pads or electrical contact regions 230 are provided within the backside surface 205 of the semiconductor substrate 204. In accordance with one embodiment of the invention, a contact pad 230 is formed by etching the backside surface 205 of the substrate 204 to form a recess 231 that extends into the semiconductor substrate 204 to a conductive line 208 located in conductive region 210. Once the recess 231 has been formed to expose conductive line 208, a metal layer 232 is deposited within the recess 231 to form the electrical contact pad 230. Metal layer 232 is deposited using well known deposition processes, such as sputtering and evaporation processes. External connections may thus be made through the backside 205 of chip 202 through contact pads 230. An insulation layer 233 may be deposited over a portion of metal layer 232. In such instances, the exposed portion of metal layer 232 defines contact pad 230 (see FIG. 2C).

As shown in FIG. 2A, the semiconductor substrate 204 may be selectively etched to form a ledge 235 that is located along the outer edge of chip 202. In such an embodiment, external connections are made to the backside of chip 202 at ledge 235.

Package substrate 250 generally includes a multiple layer interconnection structure that is used to couple the signal, power and ground connections of the chip 202 to a host motherboard or the like. Package substrate 250 includes a first set of bond pads 252 that are electrically coupled to the chip contact pads 218 by solder bump connections 220. A second set of bond pads 254 is located on the package substrate 250 at a distance away from the outer periphery of chip 202. Electrical connections through the backside 205 of chip 202 are made by bond wires 234 that connect bond pads 254 to contact pads 230. Bond wires 234 are connected to bond pads 254 by ball bonding from 236 to 237. Other bonding techniques, such as aluminum wedge bonding, and non-thermal bonding technique, may be used for coupling bond wires 234 to bond pads 254. Ball bonds 237, or other known bonding techniques, may be used to connect bond wire 234 to contact pad 230. The distance between ledge 235 and the backside 205 of semiconductor substrate 204 is established such that the bond wires 234 do not protrude above the backside surface 205. In this manner, a heat sink, or other heat transfer device, may be attached to the backside surface 205 of semiconductor substrate 206.

Figure 3:
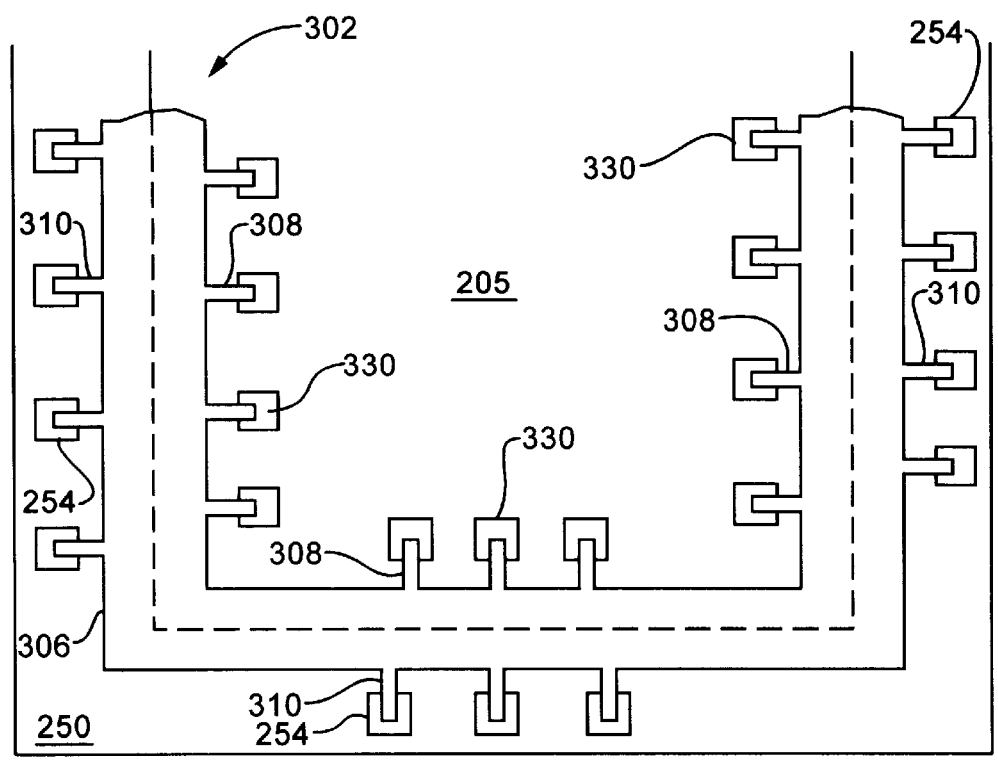
FIG. 3 is a partial top view of a chip package in another embodiment of the present invention.

In an alternative embodiment shown in FIG. 3, contact pads 330 located on the backside surface 205 of semiconductor substrate 204 are coupled to bond pads 254 by a TAB (Tape Automated Bonding) like interconnect. The TAB like interconnect 302 includes patterned metal on a polymer tape 306 which typically consist of copper foil on a polyimide tape. Inner leads 308 are bonded to contact pads 330, while outer leads 310 are attached to bond pads 254 on package substrate 250. The metallurgy of leads 308 and 310 typically consists of copper that is gold plated over a nickel flash.

Referring back to FIG. 2A, in accordance with one embodiment, conductive lines or traces 208 represent a first metal layer within conductive region 210 and are patterned as power and ground connections. By providing power and ground connections through both the backside 205 and top-side 219 of chip 202, power and ground may be more evenly distributed than in a chip having only power and ground connections through the top-side of the chip. Among other advantages, the ability to more evenly distribute power results in less noise and minimizes the need for decoupling capacitance. In addition, by routing some of the power and ground connections through the backside of the chip 202, additional signal connections may be made through the top-side of the chip.

The present invention is not limited, however, to providing power and ground connections through the backside 205 of chip 202. For example, conductive lines 208 may represent signal connections. In such instances, signal connections to chip 202 are made through both the top-side and backside of the chip.

Figure 2B:
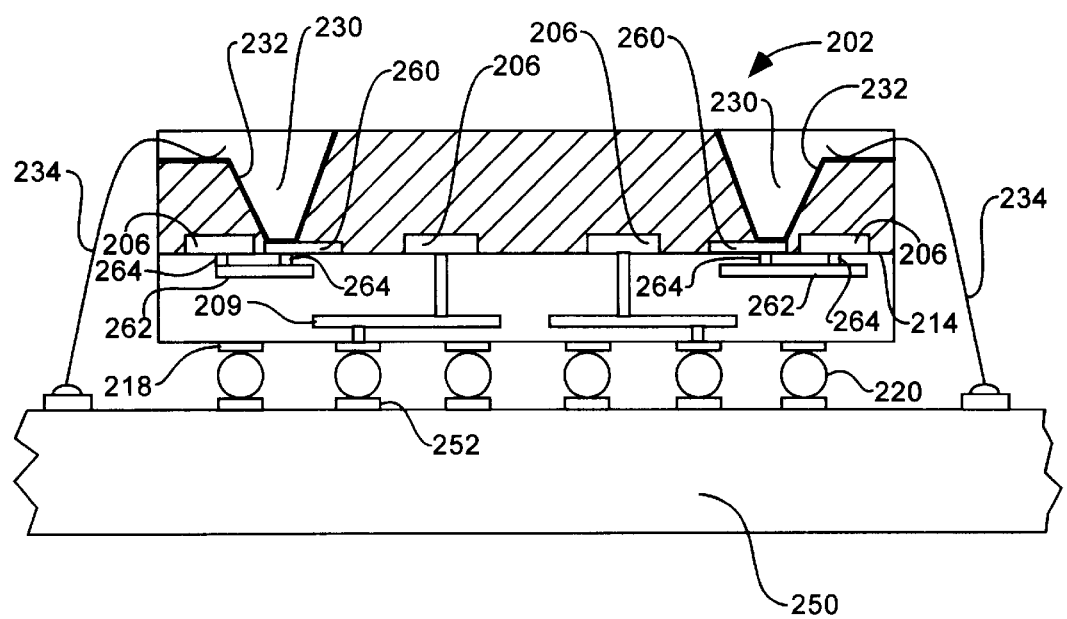
FIG. 2B is a sectioned side view of a semiconductor chip and package in another embodiment of the present invention.
Figure 2C:
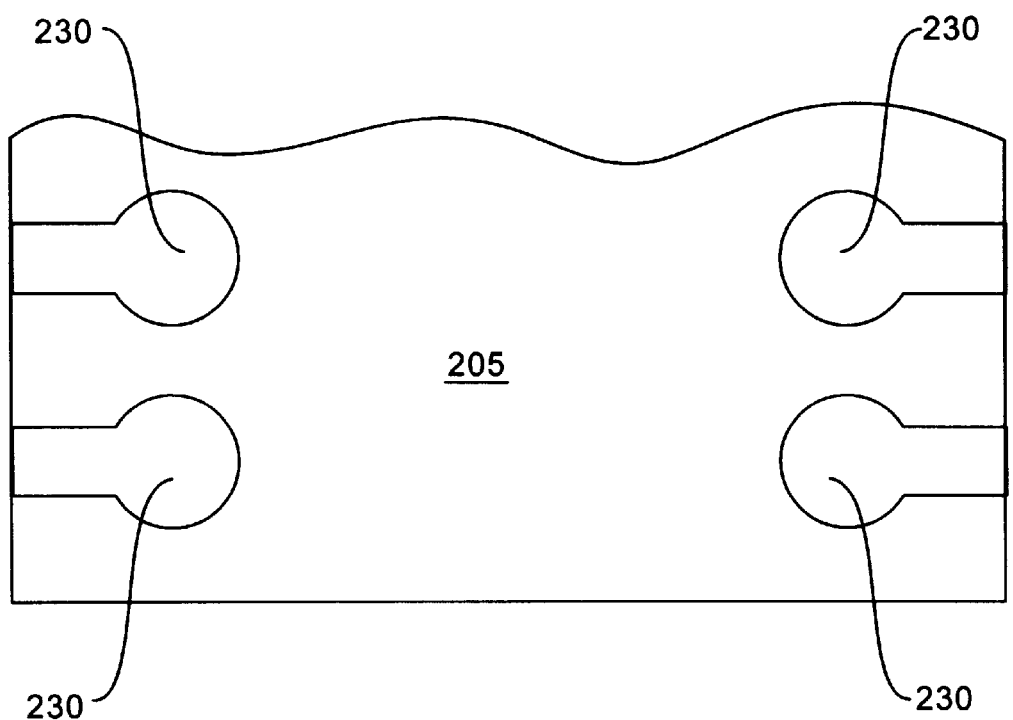
FIG. 2C is a partial top view of the semiconductor chip shown in FIGS. 2A and 2B.

In an alternative embodiment shown in FIG. 2B, metal interconnect features or traces 260 for power and ground connections are provided within the frontside surface 214 of semiconductor substrate 204 as shown in FIG. 2B, as opposed to being provided within a metal layer of the conductor region 210. As shown in FIG. 2B, power and ground features 260 are coupled to circuit elements 206 of the chip 202 by conductive traces 262 and vias 264. In such an embodiment, the backside of chip 202 is etched to expose features 260 prior to depositing metal layer 232.

Figure 4:
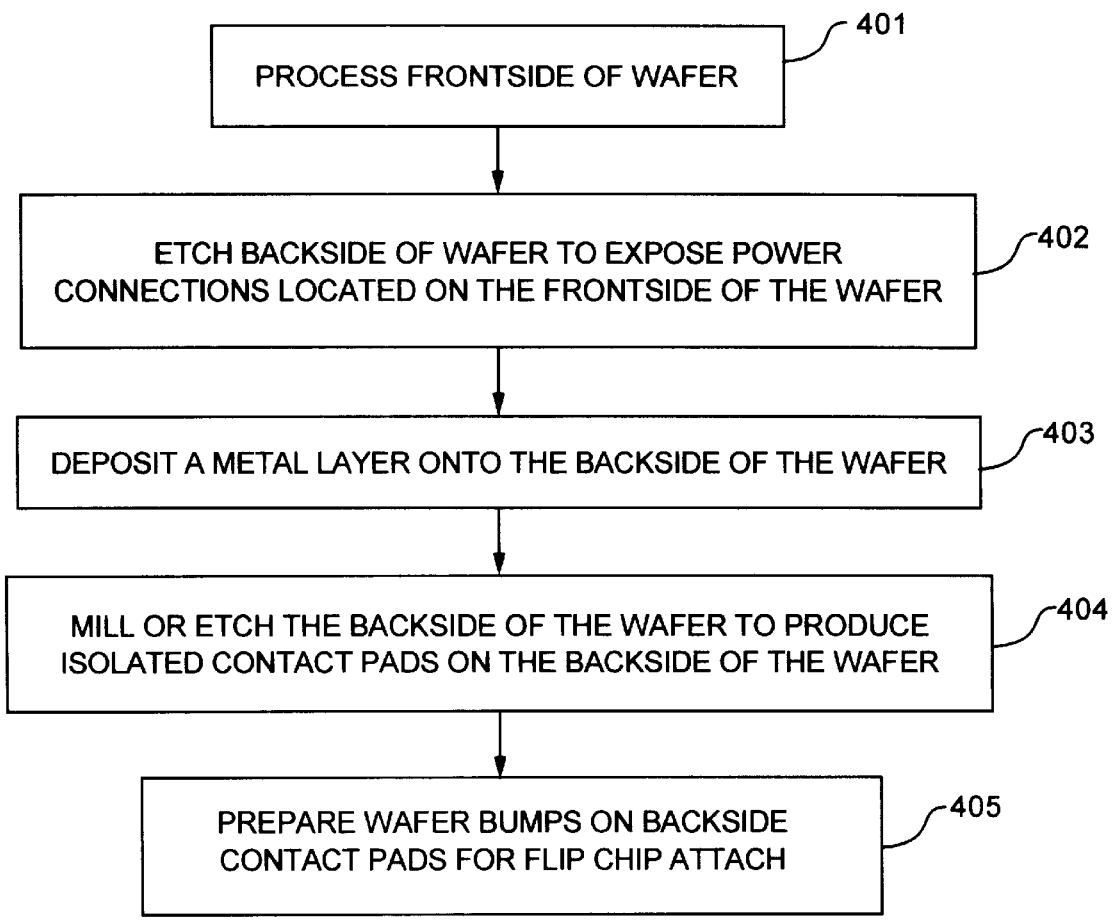
FIG. 4 is a flow chart illustrating a method of fabricating a semiconductor chip having contact pads on the top-side and backside thereof.

One method of producing a chip having electrical contacts on both the top-side and backside of the chip is illustrated in the flow chart of FIG. 4. In step 401, the frontside of a wafer is processed according to well known frontside flip-chip processes. In step 402, the backside of the wafer is etched to expose power/ground connections within the chip. As previously discussed and referenced in FIGS. 2A–2C, the power and ground connections may reside within the conductive region 210 of chip 202 or within the frontside surface 214 of the semiconductor substrate 204. The backside of the wafer may also be etched to form recessed regions within the backside of the chip. Alternatively, the backside of the wafer may be etched or milled to form vias or holes that extend from the backside of the wafer to the selected power/ground connections. When the latter etching process is used, the formation of backside contact pads 230 is achieved by globally depositing a metal layer onto the backside of the wafer (step 403). During the metal deposition step, metal is deposited within the etched vias. Once the metal layer is deposited, the backside of the wafer is back-grinded to electrically isolate contact pads 230 (step 404). After the backside contact pads 230 have been formed, the wafer bumping process for flip-chip attach may be completed on the top-side surface 219 of the wafer (step 405). Standard wafer sort, sawing and package assembly processes follow the bumping process. After the chip 202 is attached to the printed circuit board substrate by solder bonds 220, an epoxy underfill is applied around the periphery of the chip. Once the underfill process is complete, the backside contact pads 230 are electrically coupled to the printed circuit board bond pads 254 by bond wires 234 or other suitable methods.

Figure 5A:
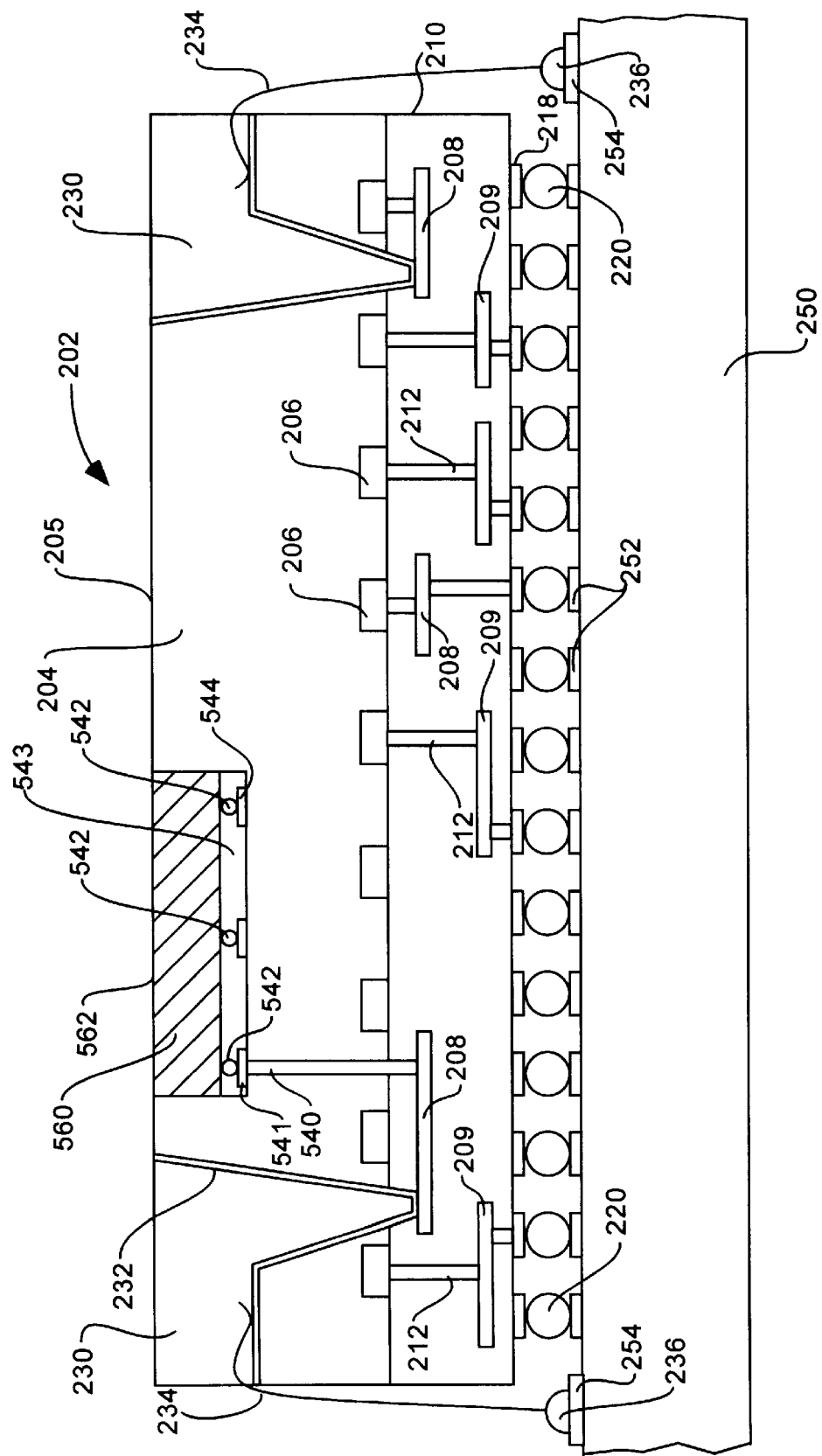
FIG. 5A is a sectioned side view of a semiconductor chip and package in another embodiment of the present invention.

Turning now to FIG. 5A, chip 202 is shown having an on-chip cache memory device 560 located within a recess 543 in the backside surface 205 of semiconductor substrate 204. Memory device 560 is electrically coupled to two sets of contact pads 541 and 544 located within recess 543 by solder bonds 542. Power/ground contacts 541 provide power to memory device 560, while signal contacts 544 provide signal connections to the memory device. Contacts 541 are electrically coupled to conductive lines 208 which represent the upper-most conductive layer in conductive region 210. Conductive lines 208 are, in turn, electrically coupled to the chip backside contact pads 230. Contacts 544 are coupled to other conductive layers (not shown) within conductive region 210. Contacts 541 and 544 are coupled to conductive region 210 by conductive was 540. The backside surface 562 of memory device 560 is co-planar with the backside surface 205 of semiconductor substrate 204 to facilitate the attachment of a heat sink or other heat removal device to the backside of chip 202.

Figure 5B:
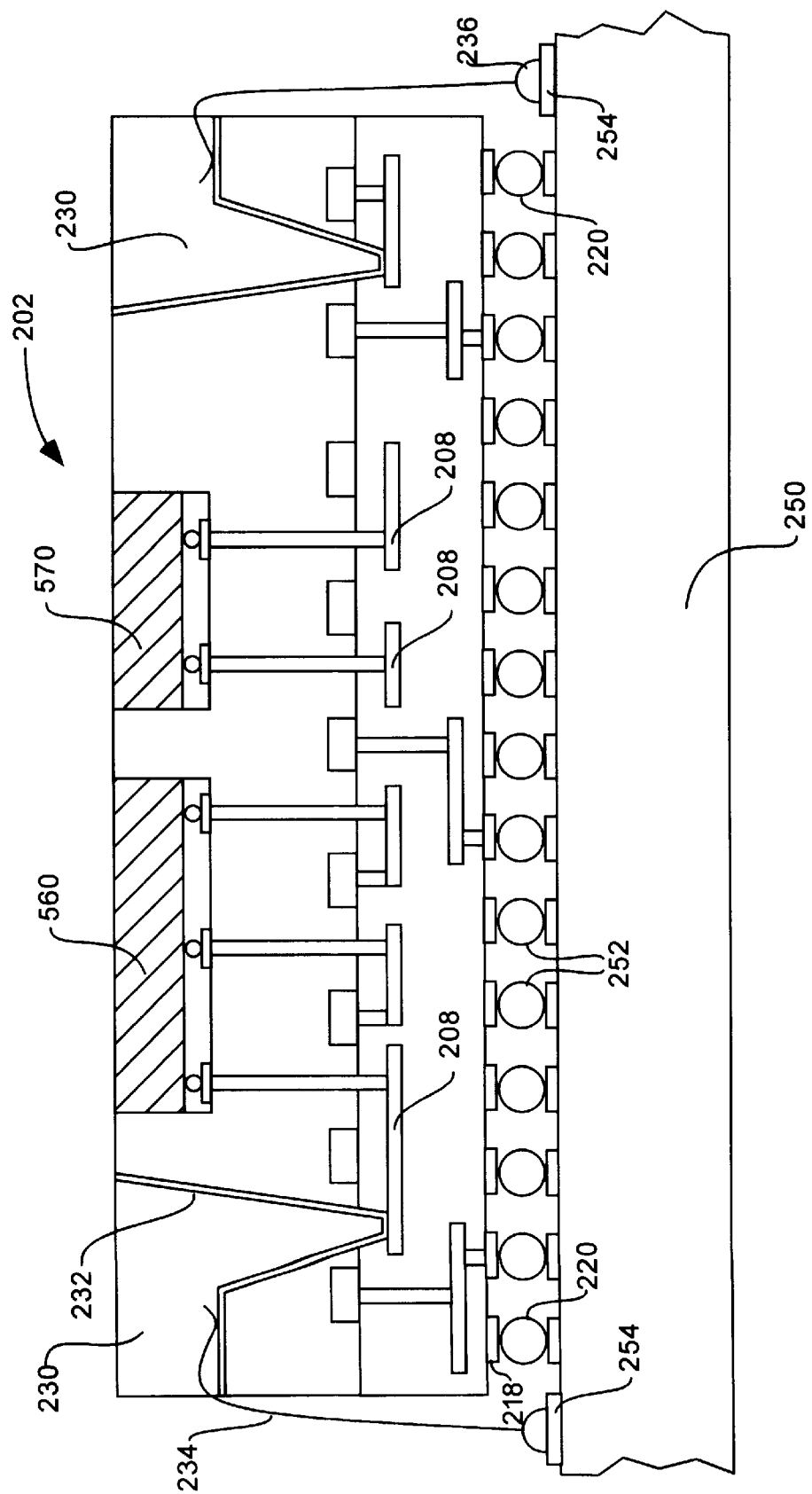
FIG. 5B is a sectioned side view of a semiconductor chip and package in yet another embodiment of the present invention.

Although a memory device 560 has been described as being coupled to the backside of chip 202, it is appreciated that other devices, such as a decoupling capacitors 570, may be electrically coupled to the backside of the chip as shown in FIG. 5B.

Figure 6:
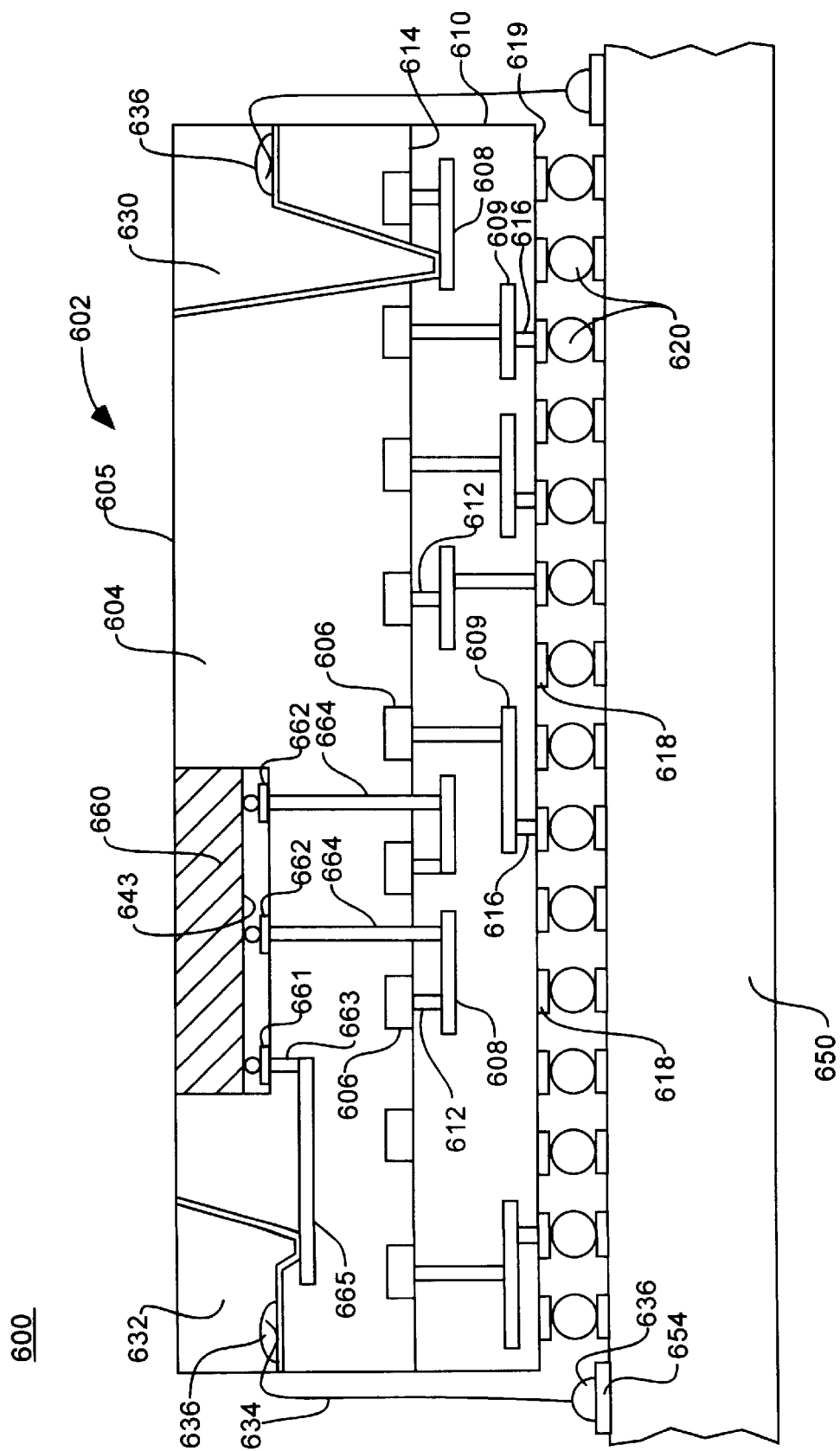
FIG. 6 is a sectioned side view of a semiconductor chip and package in another embodiment of the present invention.

FIG. 6 illustrates a side-view of a chip package 600 in another embodiment of the present invention. Package 600 includes a semiconductor chip 602 that is electrically coupled to a package substrate 650 via a plurality of solder bump connections 620 and a plurality of bond wires 634. Chip 602 includes a semiconductor substrate 604 having a plurality of circuit elements 606 formed within the frontside surface 614 of the semiconductor substrate 604. A conductor region 610 is located above the frontside surface 614 of semiconductor substrate 604. Conductor region 610 generally includes multiple layers of conductive lines 608 and 609 that are electrically coupled to the circuit elements 606 by conductive vias 612. Although only two conductor layers are shown in FIG. 6, it is noted that conductive region 610 generally includes additional conductor layers. External connections to the chip 602 are made through a first set of electrical contact pads 618 located on the top-side surface 619 of conductive region 610. Contact pads 618 are electrically coupled to conductive lines 608 and 609 by conductive vias 616.

Additional electrical contact pads are provided within the backside surface 605 of the semiconductor substrate 604. A first set of contact pads 630 is provided within the backside of chip 602. Contact pads 630 are coupled to chip circuit elements 606 through conductive region 610. A second set of contact pads 632 is located within the backside of chip 602 to provide power/ground connections to an on-chip memory device 660. Contact pad 632 is electrically coupled to a bond pad 654 on a package substrate 650 by a bond wire 634. Ball bonds 636 secure the respective ends of bond wire 634 to pads 632 and 654.

Memory device 660 is electrically coupled to chip 602 by contacts 661 and 662 located within recess 643. Contacts 662 provide signal connections to device 660 and are coupled to circuit elements 606 within the chip through conductive vias 664. Contact 661 provides a power connection to device 660. Contact 661 is coupled to a backside contact pad 632 by a metal line 665 and a conductive via 663. Thus, in accordance with the embodiment of FIG. 6, power and ground connections to memory device 660 may be made through backside contact pads 632, while signal connections to the memory device are made to the chip circuit elements 606 through conductor region 610.

Thus, semiconductor chip having electrical contact pads on the top-side and backside of the chip has been described. Although the present invention has been described with reference to specific exemplary embodiments, it will be evident that various modifications and changes may be made to these embodiments without departing from the broader spirit and scope of the invention. Accordingly, the specifications and drawings are to be regarded in an illustrative rather than a restrictive sense.

What is claimed:

1. An integrated circuit device comprising:

a semiconductor substrate having a first surface and a second surface opposite said first surface;

circuit elements disposed within said first surface;

a conductor region over said first surface having a top-side surface;

a first plurality of electrical contact pads disposed on said top-side surface and connected to said circuit elements through said conductor region;

a second plurality of electrical contact pads disposed within said second surface and connected to said circuit elements; and conductor power traces for power input, at least one of said second plurality of electrical contact pads connected to said power traces.

2. The integrated circuit device of claim 1 wherein said second plurality of electrical contact pads are adaptable for establishing a wire bond connection.

3. The integrated circuit device of claim 1 wherein said second plurality of electrical contact pads bond pads are adaptable for establishing a TAB bond connection.

4. The integrated circuit device of claim 1 wherein said conductor region further comprises conductor lines electrically connecting said circuit elements, at least one of said second plurality of electrical contact pads coupled to at least one of said conductor lines.

5. The integrated circuit device of claim 1 wherein said conductor region further comprises a first layer and a second layer of conductor lines electrically connecting said circuit elements, said first layer of conductor lines located adjacent to said circuit elements, at least one of said second plurality of electrical contact pads coupled to at least one of said first layer conductor lines.

6. The integrated circuit device of claim 1 wherein said second plurality of electrical contact pads are disposed within recesses in said second surface of said semiconductor substrate.

7. The integrated circuit device of claim 6 wherein said second plurality of electrical contact pads comprise a metal layer deposited within said recesses.

8. The integrated circuit device of claim 7 further comprising an insulation layer disposed over said metal layer.

9. The integrated circuit device of claim 1 further comprising solder bumps connected to said first plurality of electrical contact pads.

10. The integrated circuit device of claim 1 further comprising a memory device located on said integrated circuit device and electrically coupled to at least one of said second plurality of electrical contact pads.

11. An integrated circuit device comprising:

a semiconductor substrate having a first surface and a second surface opposite said first surface;

at least one recess in said second surface;

circuit elements disposed within said first surface;

a conductor region above said first surface comprising conductor lines electrically connecting said circuit elements, said conductor region having a top-side surface;

a first plurality of contact pads disposed on said top-side surface and connected to said circuit elements; and, a second plurality of contact pads disposed within said at least one recess and connected to contacts external to said substrate.

12. The integrated circuit device of claim 11 wherein said second contact pads comprise a metal layer disposed within said recess.

13. The integrated circuit device of claim 12 further comprising an insulation layer disposed over said metal layer.

14. The integrated circuit device of claim 11 wherein said second contact pads are adaptable for establishing a wire bond connection.

15. The integrated circuit device of claim 11 wherein said second contact pads are adaptable for establishing a TAB bond connection.

16. An apparatus comprising:

a semiconductor substrate having a first surface and a second surface opposite said first surface;

circuit elements disposed within said first surface;

a conductor region located over said first surface having a top-side surface;

a first plurality of contact pads disposed on said top-side surface and connected to said circuit elements through said conductor region;

a second plurality of contact pads disposed within said second surface and connected to said circuit elements; and, a printed circuit board having a first set of bond pads and a second set of bond pads, said first plurality of contact pads being electrically coupled to said first set of bond pads and said second plurality of contact pads being electrically coupled to said second set of bond pads.

17. The apparatus of claim 16 wherein at least one of said second plurality of contact pads is electrically coupled to said second set of bond pads by a wire bond.

18. The apparatus of claim 16 wherein said second plurality of contact pads is electrically coupled to said second set of bond pads by a TAB bond.

19. The apparatus of claim 16 wherein said first plurality of contact pads is coupled to said first set of bond pads by solder connections.

20. The apparatus of claim 16 wherein said second plurality of electrical contact pads are disposed within recesses in said second surface of said semiconductor substrate.

21. The apparatus of claim 20 wherein said second plurality of contact pads comprise a metal layer deposited within said recesses.

22. The apparatus of claim 21 further comprising an insulation layer disposed over said metal layer.

* * * * *